(12) United States Patent
Todd et al.

(10) Patent No.: US 11,374,124 B2
(45) Date of Patent: *Jun. 28, 2022

(54) PROTECTION OF DRAIN EXTENDED TRANSISTOR FIELD OXIDE

(71) Applicant: Texas Instruments Incorporated, Dallas, TX (US)

(72) Inventors: James Robert Todd, Plano, TX (US); Xiaoju Wu, Dallas, TX (US); Henry Litzmann Edwards, Garland, TX (US); Binghua Hu, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 66 days.

This patent is subject to a terminal disclaimer.

(21) Appl. No.: 16/021,647

(22) Filed: Jun. 28, 2018

(65) Prior Publication Data
US 2020/0006550 A1    Jan. 2, 2020

(51) Int. Cl.
| H01L 29/78 | (2006.01) |
| H01L 29/06 | (2006.01) |
| H01L 21/762 | (2006.01) |
| H01L 21/285 | (2006.01) |
| H01L 29/417 | (2006.01) |
| H01L 29/66 | (2006.01) |
| H01L 49/02 | (2006.01) |
| H01L 27/06 | (2006.01) |

(52) U.S. Cl.
CPC .... *H01L 29/7816* (2013.01); *H01L 21/28518* (2013.01); *H01L 21/76202* (2013.01); *H01L 21/76224* (2013.01); *H01L 29/0696* (2013.01); *H01L 29/41758* (2013.01); *H01L 29/66689* (2013.01); *H01L 27/0629* (2013.01); *H01L 28/24* (2013.01)

(58) Field of Classification Search
CPC .......... H01L 29/7816; H01L 21/28518; H01L 21/76202; H01L 21/76224; H01L 29/0696; H01L 29/41758; H01L 29/66689; H01L 27/0629
USPC ....................................................... 257/337
See application file for complete search history.

(56) References Cited

U.S. PATENT DOCUMENTS

| 6,587,320 B1 | 7/2003 | Russ et al. |
| 7,141,455 B2 | 11/2006 | Hu et al. |
| 7,696,049 B2 | 4/2010 | Hu et al. |
| 7,713,825 B2 | 5/2010 | Hu et al. |
| 7,732,863 B2 | 6/2010 | Pendharkar et al. |
| 7,745,294 B2 | 6/2010 | Pendharkar et al. |
| 7,772,075 B2 | 8/2010 | Pendharkar et al. |
| 7,772,644 B2 | 8/2010 | Pendharkar et al. |
| 7,893,499 B2 | 2/2011 | Denison et al. |

(Continued)

*Primary Examiner* — Xia L Cross
(74) *Attorney, Agent, or Firm* — Jacqueline J. Garner; Charles A. Brill; Frank D. Cimino

(57) ABSTRACT

Described examples include integrated circuits, drain extended transistors and fabrication methods in which a silicide block material or other protection layer is formed on a field oxide structure above a drift region to protect the field oxide structure from damage during deglaze processing. Further described examples include a shallow trench isolation (STI) structure that laterally surrounds an active region of a semiconductor substrate, where the STI structure is laterally spaced from the oxide structure, and is formed under gate contacts of the transistor.

16 Claims, 15 Drawing Sheets

(56) References Cited

U.S. PATENT DOCUMENTS

| | | |
|---|---|---|
| 7,989,232 B2 | 8/2011 | Wand et al. |
| 8,114,744 B2 | 2/2012 | Chatterjee et al. |
| 8,124,482 B2 | 2/2012 | Denison et al. |
| 8,253,193 B2 | 8/2012 | Denison et al. |
| 8,264,038 B2 | 9/2012 | Pendharkar et al. |
| 8,686,502 B2 | 4/2014 | Raghavan et al. |
| 8,704,271 B2 | 4/2014 | Edwards et al. |
| 9,006,833 B2 | 4/2015 | Edwards et al. |
| 9,076,863 B2 | 7/2015 | Tamura et al. |
| 9,306,013 B2 | 4/2016 | Babcock et al. |
| 9,461,032 B1 | 10/2016 | Edwards |
| 9,543,430 B2 | 1/2017 | Edwards |
| 9,608,105 B2 | 3/2017 | Tamura et al. |
| 9,633,994 B2 | 4/2017 | Babcock et al. |
| 9,698,246 B1 | 7/2017 | Edwards et al. |
| 9,887,288 B2 | 2/2018 | Edwards et al. |
| 2004/0079974 A1 | 4/2004 | Lin et al. |
| 2009/0191688 A1 | 7/2009 | Hu et al. |
| 2010/0137143 A1* | 6/2010 | Rothberg ............ C12Q 1/6869 506/2 |
| 2012/0086497 A1 | 4/2012 | Vorhaus |
| 2013/0105909 A1* | 5/2013 | Hu ..................... H01L 29/1083 257/369 |
| 2013/0240980 A1 | 9/2013 | Raghavan et al. |
| 2016/0218002 A1* | 7/2016 | Steinbrenner .......... H01L 29/51 |
| 2017/0077294 A1 | 3/2017 | Edwards |
| 2017/0084738 A1 | 3/2017 | Zhang et al. |
| 2017/0179260 A1* | 6/2017 | Edwards ............ H01L 27/0928 |

\* cited by examiner

PROTECTION OF DRAIN EXTENDED TRANSISTOR FIELD OXIDE

CROSS-REFERENCE TO RELATED APPLICATIONS

This application is related to co-pending and co-assigned patent application Ser. No. 16/021,601, entitled "DRAIN EXTENDED TRANSISTOR", filed on even date herewith, the entirety of which is hereby incorporated by reference. This application is related to co-pending and co-assigned patent application Ser. No. 16/021,772, entitled "DRAIN CENTERED LDMOS TRANSISTOR WITH INTEGRATED DUMMY PATTERNS", filed on even date herewith, the entirety of which is hereby incorporated by reference.

BACKGROUND

Drain extended transistors are useful in power switching circuits and other applications in which high voltage transistors are integrated with logic and other low voltage transistors on a single integrated circuit (IC). The design of the extended drain combines efficient operation as a low side switch in a switching power supply to provide low source-drain resistance (RDSON) during the on state, along with the ability to block or withstand high off-state voltages between the drain and the source or gate. The extended drain provides a relatively lightly doped drift region to extend the high voltage drain away from the edge of the channel region. A planar drift region can be used to increase the reverse blocking voltage beyond the voltage rating of the gate oxide in a particular process. For even higher drain voltage rating, the drain side of the gate polysilicon is spaced from the drift region by a field relief oxide to facilitate more complete depletion of the drift region. Reduced surface field (RESURF) profiled doping can be used for full reverse bias depletion of the drift region. The drift region doping level or dopant concentration is preferably higher near the connection to the transistor channel region to mitigate channel hot carrier injection into the gate and enhance the transistor reliability.

SUMMARY

Described examples include integrated circuits, and drain extended transistors, in which a silicide block material or other protection layer is formed on a field oxide structure above a drift region to protect the field oxide structure from damage during deglaze processing. Further described examples include a shallow trench isolation (STI) structure that laterally surrounds an active region of a semiconductor substrate, where the STI structure is laterally spaced from the oxide structure, and is formed under gate contacts of the transistor. Further described examples include drain extended transistor fabrication methods, including forming a protection layer that extends on an oxide structure between a gate structure and a drain region. Further example drain extended transistor fabrication methods include forming an STI structure that laterally surrounds an active region of a semiconductor substrate, where the STI structure is laterally spaced from an oxide structure.

DETAILED DESCRIPTION

Figure 1:
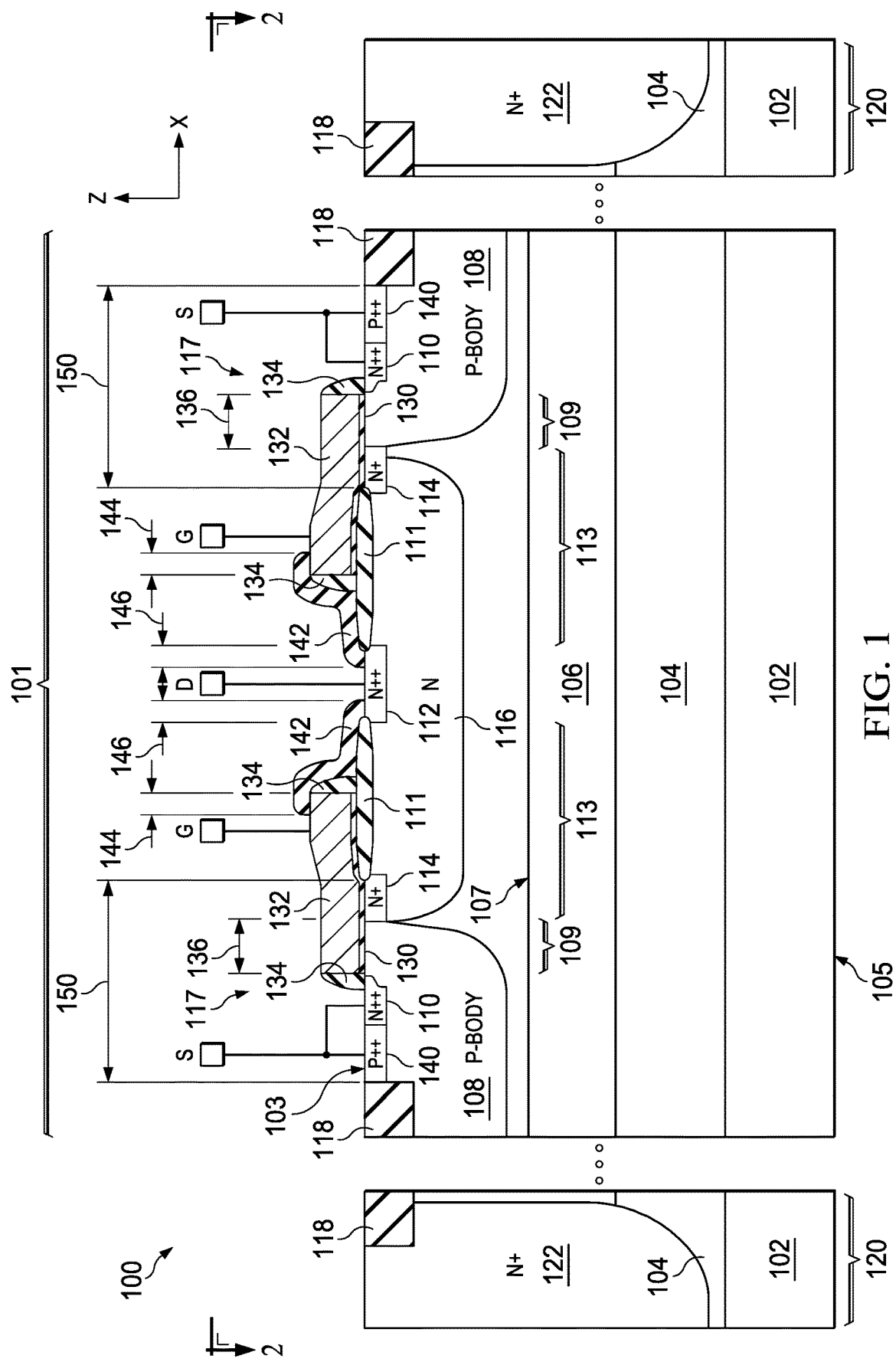
FIG. 1 is a partial sectional side elevation view of an integrated circuit including a drain extended transistor with a field oxide protection layer.
Figure 2:
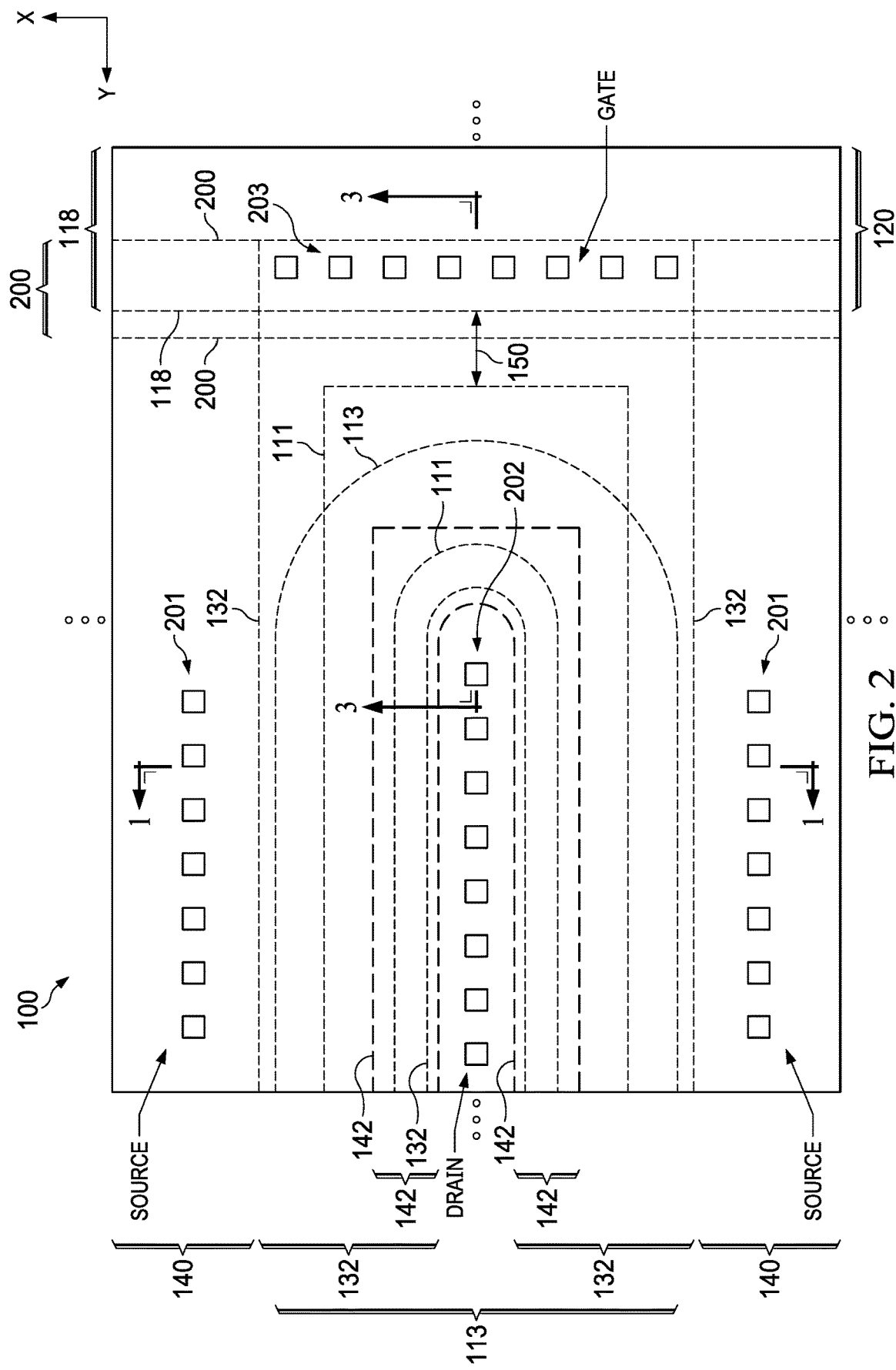
FIG. 2 is a partial top plan view of the integrated circuit of FIG. 1.
Figure 3:
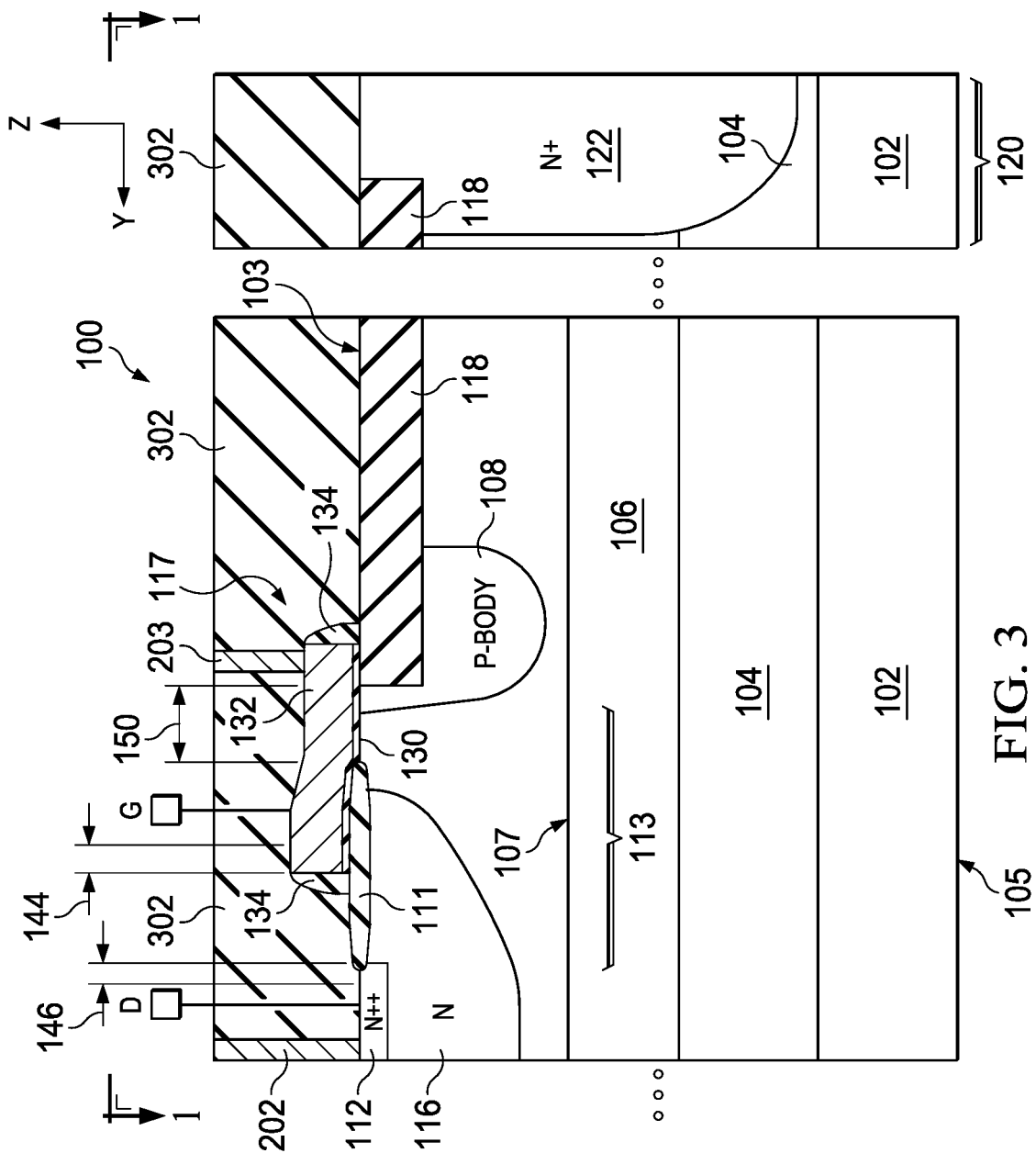
FIG. 3 is a partial sectional side elevation view of the integrated circuit along line 3-3 of FIG. 2.

Referring initially to FIGS. 1-3, FIG. 1 shows a partial side view of an integrated circuit (IC) 100 with a drain extended transistor 101 fabricated from a semiconductor substrate 102. FIG. 2 shows a partial top view of the IC 100 and a portion of the transistor 101, and FIG. 3 shows a partial end view of an end-cap portion of the transistor 101 in the IC 100. In the drawings, like reference numerals refer to like elements throughout, and the various features are not necessarily drawn to scale. In the following discussion and in the claims, the terms "including", "includes", "having", "has", "with", or variants thereof are intended to be inclusive in a manner similar to the term "comprising", and thus should be interpreted to mean "including, but not limited to". Drain extended transistors can include drain-extended NMOS (DENMOS), drain-extended PMOS (DEPMOS), and/or laterally diffused MOS (LDMOS) transistors, as well as groups of DENMOS and DEPMOS, referred to as complimentary drain extended MOS or DECMOS transistors. Described examples include doped regions of various semiconductor structures which may be characterized as p-doped and/or n-doped regions or portions, and include regions that have majority carrier dopants of a particular type, such as n-type dopants or p-type dopants.

The illustrated transistor 101 is an n-channel drain extended transistor (e.g., DENMOS). Other implementations are possible within the scope of the present disclosure, including p-channel drain extended transistor examples (e.g., DEPMOS) using oppositely doped structures and regions. In one example, the substrate 102 is a p-doped silicon substrate or wafer, with a first (e.g., top) side 103, various buried layers 104, 106 formed therein, and a second (e.g., bottom) side 105. In another possible implementation, the substrate 102 includes one or more epitaxial silicon layers (not shown) formed on a top surface, with one or more of the buried layers 104, 106 in epitaxial layers of the substrate. The illustrated substrate 102 includes a first doped layer 106 that includes p-type majority carrier dopants. In one implementation, the p-type layer includes a portion implanted with boron to form a p-type buried layer (PBL) with an upper or top side 107, and a further portion that extends over (e.g., directly on) the p-type buried layer to form the upper side 103 and to provide a composite p-doped first layer 106.

The example substrate 102 in FIG. 1 also include a second doped layer 104 (e.g., an n-type buried layer or NBL) that includes n-type majority carrier dopants. The second doped layer 104 extends along a first direction (e.g., the vertical Z direction in FIG. 1) from beneath the first doped layer 106 toward the second side 105. In one example, a first epitaxial silicon layer is formed over the upper surface of a silicon wafer, and all or a portion of the first epitaxial layer is implanted with n-type dopants (e.g., phosphorus, etc.) to form the n-type buried layer. In this example, a second epitaxial silicon layer is formed over the first epitaxial layer, and all or a portion of the second epitaxial layer is implanted with p-type dopants (e.g., boron, etc.) to form the p-type buried layer with the upper side 107. In one example, the PBL region is formed using ion implantation through the final silicon surface (e.g., the top of the second epitaxial layer), with a depth set by using a high implantation energy.

The example IC 100 includes an n-channel drain extended transistor 101 (e.g., a DENMOS field effect transistor) with a drain-centered configuration. In other examples, a p-channel drain extended transistor (e.g., a DEPMOS) can be constructed as described below, having oppositely doped structures and regions. The example transistor 101 includes a body region 108 having p-type majority carrier dopants. The body region 108 extends along the Z direction into the first doped layer 106 from the first side 103. The body region 108 includes a channel portion 109 that extends to the top side 103 of the substrate 102. The transistor 101 also includes a source region 110 that extends along the Z direction into the first doped layer 106 from the first side 103. The source region 110 extends laterally along an orthogonal second direction (e.g., the X direction in FIG. 1) adjacent a first (e.g., inner) side of the channel portion 109 of the body region 108. The source region 110 in the illustrated n-channel transistor includes n-type majority carrier dopants (e.g., labeled N++ in the drawings).

The transistor 101 in FIG. 1 has an extended drain structure that includes an oxide structure 111 (e.g., field oxide) that extends along the first side 103 to provide a field gap for a laterally diffused extended drain. The example drain-centered transistor 101 includes gate and source structures that extend laterally around a drain region 112, although not a requirement of all possible implementations. The oxide structure 111 laterally encircles the drain region 112. The oxide structure 111 includes a first end (e.g., an outer end) spaced along the X direction from the channel portion 109 of the body region 108, as well as a second (e.g., inner) end. The transistor 101 further includes a drain region 112 that extends along the Z direction into the first doped layer 106 from the first side 103. The drain region 112 includes a first end adjacent the second end of the oxide structure 111 and n-type majority carrier dopants (e.g., labeled N++ in the drawings). In the illustrated example, the field oxide structure 111 is a local oxidation of silicon (LOCOS) structure.

The extended drain structure includes a drift region 113 with a first drift region portion 114 (e.g., connection portion, labeled N+ in the drawings). The first drift region portion 114 extends along the Z direction into the first doped layer 106 from the first side 103, and extends laterally along the X direction from the channel portion 109 of the body region 108 to the first end of the oxide structure 111. The first drift region portion 114 includes n-type majority carrier dopants having a first dopant concentration. In certain examples, the dopant concentration of the first drift region portion 114, and concentrations of other regions in the IC 100, can be profiled and can vary within a range. In the illustrated example, the drift region 113 also includes a second drift region portion 116 (e.g., labeled N in the drawings) that includes n-type majority carrier dopants having a second dopant concentration less than the first dopant concentration. The second drift region portion 116 extends between the first drift region portion 114 and the drain region 112. In one example, all or at least a portion of the oxide structure 111 extends between the second drift region portion 116 and the first side 103 along the Z direction. The second drift region portion 116 extends laterally along the X direction from the first drift region portion 114 to the drain region 112.

The example transistor 101 also includes a gate structure 117 that extends at least partially over the channel portion 109 of the body region 108. The illustrated IC 100 further includes isolation features, including an outer oxide structure 118 that encircles the transistor 101 along the first (e.g., top) side 103. The oxide structure 118 in one example is a shallow trench isolation (STI) structure, which is disposed laterally outward of the source region 110. In the illustrated example, the STI structure 118 defines an end of an active region of the semiconductor substrate 102 in which the transistor 101 is formed. The example STI structure 118 in one example is adjacent to an isolation structure 120 that encircles or surrounds the transistor 101 and the active region of the IC 100. The isolation structure 120 includes a deep n-doped region 122 (e.g., labeled N+) that extends laterally outward of the active region.

In another implementation, the isolation structure can be a deep trench structure with doped sidewall structures (not shown) that extend from the top side 103 of the substrate 102 through the PBL region 106, and into the NBL region 104. In certain examples, the isolation structure includes sidewall structures (not shown) on opposite lateral sides of deposited field oxide structures (not shown) that extend into the lower portion of the p substrate 102 beneath the NBL layer 104. The field oxide structures in this example laterally surround a P+ implanted silicon structure (not shown) that also extends from the first side 103 into the p substrate 102 below the NBL region 104. In one example, the IC 100 further includes contact structures (not shown in FIG. 1) that provide electrical connection to one or more features of the transistor 101, along with a metallization structure (not shown) that covers the transistor 101 and provides internal and/or external electrical interconnection to the transistor source, drain and gate terminals, respectively designated S, D and G in FIG. 1. The metallization structure can include a pre-metal dielectric (PMD) material formed over the illustrated structure, with contact structures formed therein to provide electrical interconnection access for further upper metallization layers (not shown).

The example gate structure 117 laterally encircles the drain region 112. The illustrated gate structure 117 includes a gate dielectric layer 130 formed over the first side 103 of the substrate 102, a gate patterned electrode 132 (e.g., polysilicon) on the gate dielectric layer 130, and lateral sidewall spacers 134 along lateral sides of the patterned gate electrode 132. The gate structure 117 provides an effective channel length 136 (Leff) of the drain extended transistor 101 from a first end of the gate electrode 132 to an inner side of the channel portion 109 along the X direction. The example transistor 101 also includes a p-type body contact region 140 laterally adjacent to the source region 110 to provide an electrical connection to the body region 108 (labeled P++ in FIG. 1).

In the example IC 100 of FIGS. 1-3, the transistor 101 includes a protection layer 142 that extends on the oxide structure 111 between the gate structure 117 and the drain region 112. In one example, the protection layer 142 includes an oxide material. In another example, the protection layer 142 includes a nitride material. In one example, the protection layer 142 includes an oxynitride material. As described further below in connection with FIGS. 4, 14 and 15, the protection layer 142 in one example is a silicide block material that mitigates or prevents silicidation of the oxide material 111 during deglazing and other operations during and after silicide contact formation during fabrication of the IC 100. The protection layer 142 in this example can be used to concurrently protect the oxide structure 111 and to provide control of silicide formation in other components of the IC 100, such as a resistor component fabricated in the IC 100 (e.g., FIG. 15 below). In this example, no additional masks or processing steps are needed to provide the protection layer 142 in the transistor 101 during fabrication of the IC 100.

In one example, the protection layer 142 extends on a portion of (e.g., overlaps) the gate structure 117 by a distance 144 as shown in FIG. 1. In one example, the distance 144 is 0.1 μm or more. The protection layer 142 in the illustrated example also extends on (e.g., overlaps) a portion of the drain region 112 by a distance 146. In one example, the distance 146 is 0.1 μm or more. As shown in FIG. 1, the STI structure 118 is laterally spaced from the field oxide (LOCOS) structure 111 by a distance 150 along the X direction.

FIG. 2 shows a top view of a portion of the IC 100 in the X-Y plane taken along line 2-2 in FIG. 1. In this example, the isolation structure 120 laterally surrounds the active region of the semiconductor substrate 102. The isolation structure 120 in this example includes the STI structure 118, and a shallow p-type doped region 200, such as an implanted p-type well structure. The STI structure 118 extends on the right in the partial view of FIG. 2, and defines an end of the active region of the semiconductor substrate 102. FIG. 2 shows the IC 100 with a metallization structure that includes source contacts 201 on either side of centrally disposed drain contacts 202 in the example drain-centered configuration. FIG. 3 illustrates a pre-metal dielectric (PMD) layer 302 formed over the transistor 101 and over the top side 103 of the substrate. The illustrated portion of the IC 100 in FIG. 3 includes example drain and gate conductive contacts 202 and 203 (e.g., tungsten), that extend from the corresponding drain structure 112 and gate structure 132 to the top surface of the PMD layer 302. The top view of FIG. 2 and the end view of FIG. 3 illustrate an end cap structure of the transistor. The end cap structure includes gate contacts 203 that are electrically connected to a first portion of the gate electrode 132 outside the active region of the semiconductor substrate 102. As shown in FIGS. 2 and 3, the example STI structure 118 is laterally spaced from the field oxide (LOCOS) structure 111 by the distance 150 along the Y direction that is substantially perpendicular to the X direction. In one example, the first distance 150 is 0.5 μm or more.

As shown in FIG. 2, the drain extended transistor 101 in one example includes multiple substantially parallel transistor fingers that extend along the Y direction. The individual transistor fingers include a source finger that extends in the active region of the semiconductor substrate 102 between a first finger end and a second finger end along the Y direction. The individual transistor fingers also include a drain finger that extends in the active region of the semiconductor substrate 102 between the first finger end and the second finger end along the Y direction, and a gate finger that extends along the Y direction Y. The gate contact 203 is electrically connected to a first portion of the gate electrode 132 outside the active region of the semiconductor substrate 102, as shown in FIGS. 2 and 3. The source region 110 in this example includes a plurality of the source fingers, and the drain region 112 includes a plurality of the drain fingers. In this example, the gate structure 117 includes a plurality of the gate fingers, and the gate structure 117 extends beyond the first transistor end along the Y direction outside the active region of the semiconductor substrate 102. Also, the first portion of the gate electrode 132 is above the STI structure 118. This facilitates fabrication of the gate contact structures 203 above the shallow trench isolation structure 118 and mitigates formation of silicide grain boundary that could adversely interact with a contact etch chemistry and punch through a thinner oxide. The spatial relationship between the STI structure 118 and the LOCOS field oxide structure 111 facilitates improved production yield, compact layout, and low gate capacitance.

Figure 4:
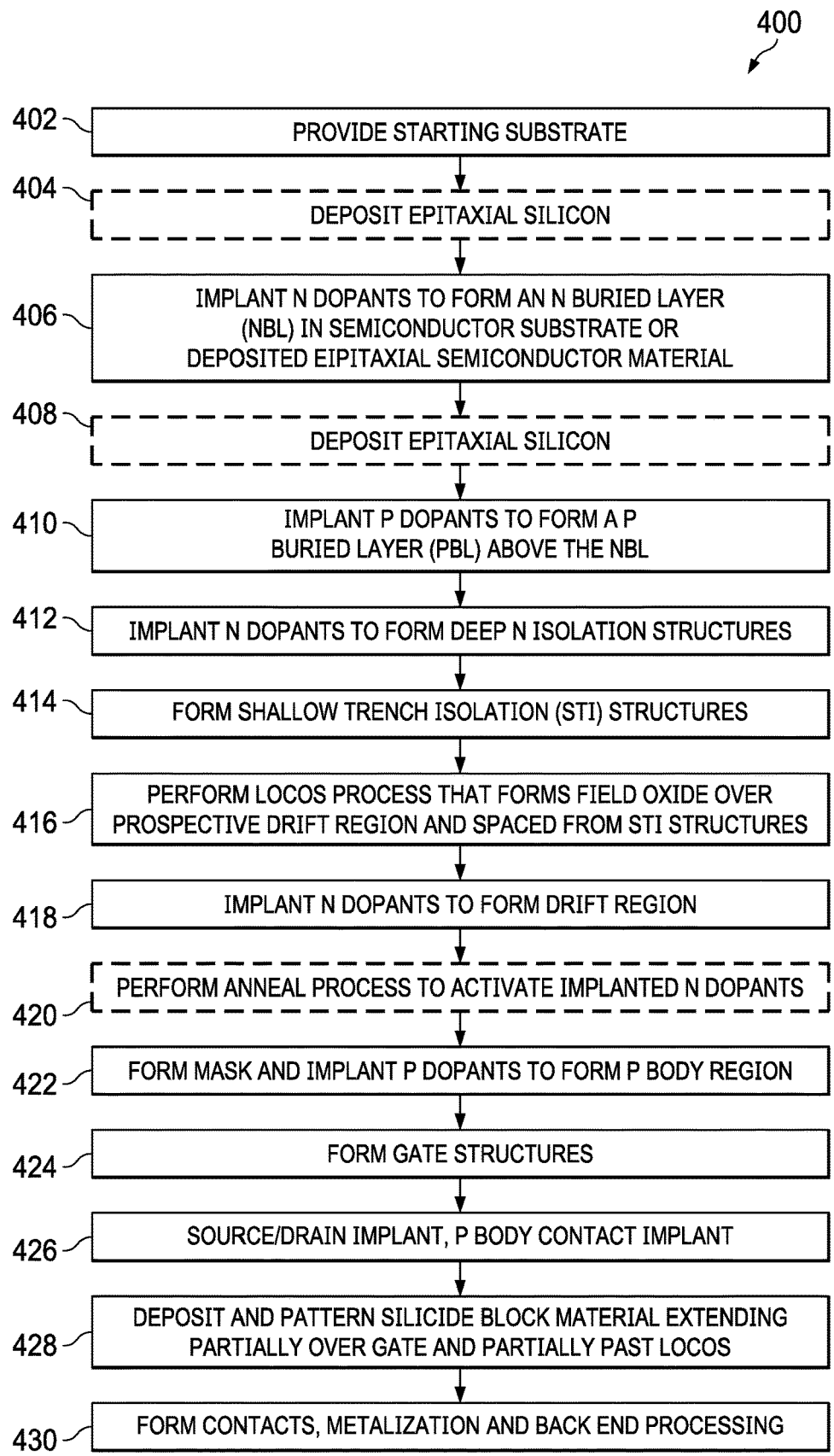
FIG. 4 is a flow diagram showing a method for making a drain extended transistor.
Figure 5:
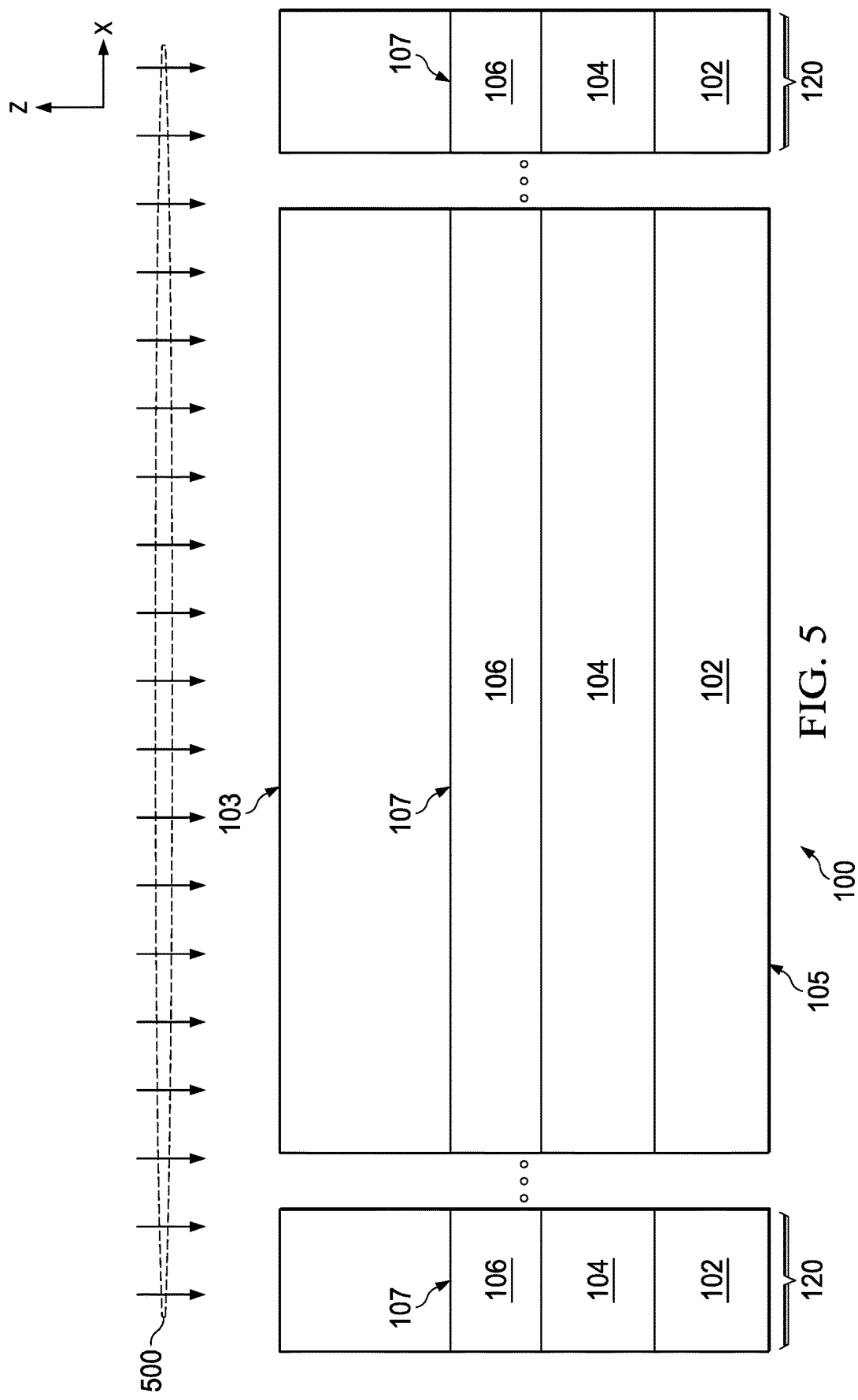
FIGS. 5-15 are partial sectional side elevation views of the integrated circuit at different stages of fabrication to provide the drain extended transistor of FIGS. 1-3.

FIG. 4 shows a method 400 to fabricate an integrated circuit and an extended drain transistor, such as the transistor 101 of FIGS. 1-3. FIGS. 5-15 illustrate processing of the example integrated circuit 100 at various intermediate stages of fabrication to produce the n-channel transistor 101 of FIG. 1 according to the method 400. In other examples, p-channel extended drain transistors can be fabricated according to the method 400 using opposite dopant implantation steps and materials. A starting substrate is provided at 402. In one example, a p-doped silicon wafer substrate is provided at 402, such as the substrate 102 in FIG. 5. The example substrate 102 includes the first (e.g., top) side 103, and a second (e.g., bottom) side 105 as shown in FIG. 5. In another example, a silicon on insulator (SOI) starting wafer is used. A substrate of a different semiconductor material can be provided at 402 in other implementations. In one example, one or more epitaxial layers (not shown) are formed on the substrate 102 using epitaxial growth deposition processing (e.g., at 404 and 408), and the transistor 101 is formed in an epitaxial layer of the substrate 102. In other implementations, the epitaxial layer and the processing at 404 are omitted.

In the illustrated example, a first epitaxial silicon deposition process is performed at 404, for example, to form a first epitaxial layer over a silicon substrate 102. An implantation process is performed at 406, which implants n-type dopants (e.g., phosphorus) into the substrate 102 (or into the first epitaxial layer) to form an NBL region in the substrate 102 (e.g., NBL 104 in FIG. 5). In one example, the n-type dopants are implanted via a blanket implantation process (not shown in FIG. 5) into a first epitaxial layer to form the NBL region 104 at 406, followed by deposition of a second epitaxial layer at 408 over the NBL doped layer 104. At 410, an implantation process is performed (e.g., blanket implantation process 500 in FIG. 5), which implants p-type dopants (e.g., boron) into the second epitaxial layer of the substrate 102 to form a p-doped layer (e.g., PBL 106) in the substrate 102 above the NBL region 104. In one possible implementation, the drain extended transistor 101 is subsequently formed on and/or in the second epitaxial layer.

Figure 6:
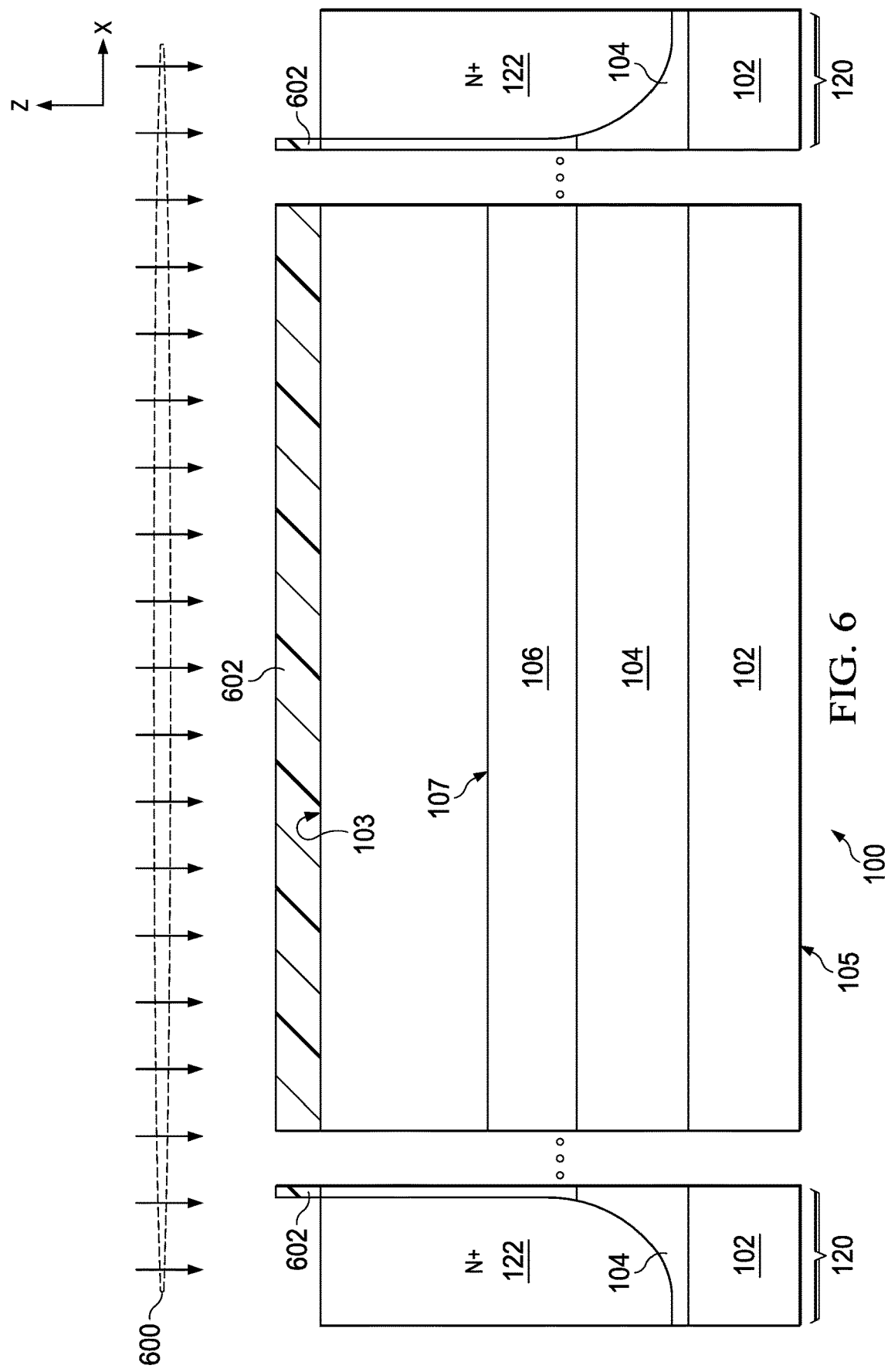
Figure 7:
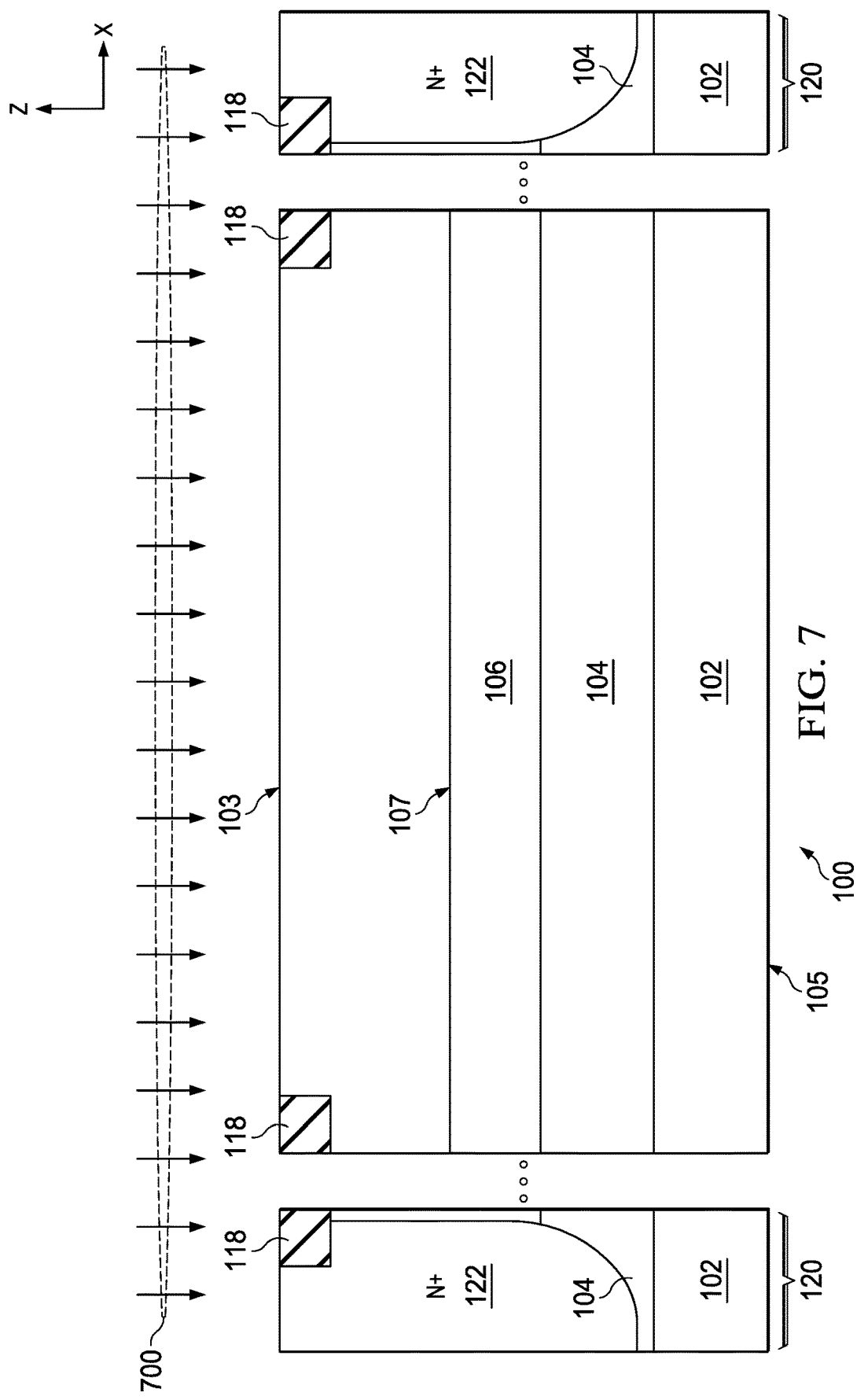

The illustrated method 400 in one example includes forming an isolation structure at 412 that surrounds an active region of the substrate and any deposited epitaxial layers (e.g., isolation structure 120 in FIGS. 1-3). In one example, a masked implantation process is performed at 412, which implants n-type dopants into exposed portions of the structure outside the prospective active region to form a deep n-doped region. FIG. 6 illustrates one example, in which a deposition process 600 implants phosphorus or other n-type dopants using an implantation mask 602, to form the deep n-doped region 122 (e.g., labeled N+) that extends laterally outward of the active region. In one implementation, the n-doped region 122 is implanted with suitable implantation energy to extend into at least an upper portion of the NBL region 104. The example method 400 also includes forming a shallow trench isolation STI structure 118 at 414, which laterally surrounds the prospective active region of the semiconductor substrate 102. FIG. 7 illustrates a shallow trench isolation process 700 that forms the STI structure 118 to complete the isolation structure 120. In one example, the isolation structure 118 is formed laterally outward of the prospective source region using the process 700. In one example, trenches are etched and filled with oxide to form the structure 118. In one example, the STI isolation structure 118 in FIG. 1 extends downward into the substrate to a depth of approximately 0.35 p.m. The isolation structure 118 may, but need not, have an upper surface that is generally coplanar with the upper surface of the substrate 102.

In another example, the isolation structure 120 can be fabricated using deep trench processing techniques. In one example, a trench is etched through the PBL layer 106 and the NBL layer 104 and into the portion of the p substrate 102 beneath the NBL layer 104. An N+implantation is performed to dope trench sidewall structures (not shown) to a depth into the NBL layer 104, and the sidewalls are oxidized to form field oxide structures (not shown). A silicon deposition process is performed with in-situ P+doping to form a p-doped structure between the oxide structures, leaving a deep trench isolation structure (not shown).

Figure 8:
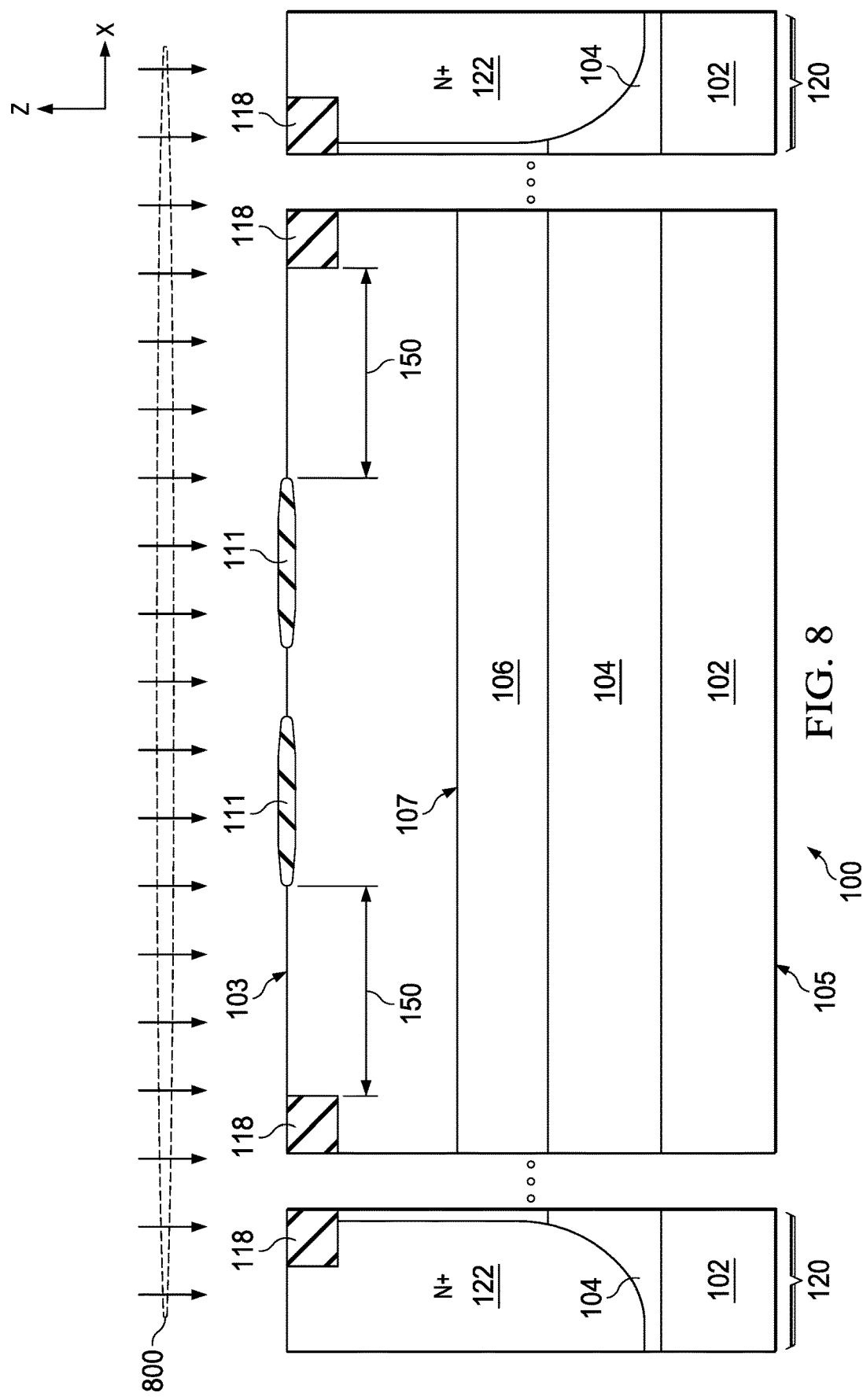
Figure 9:
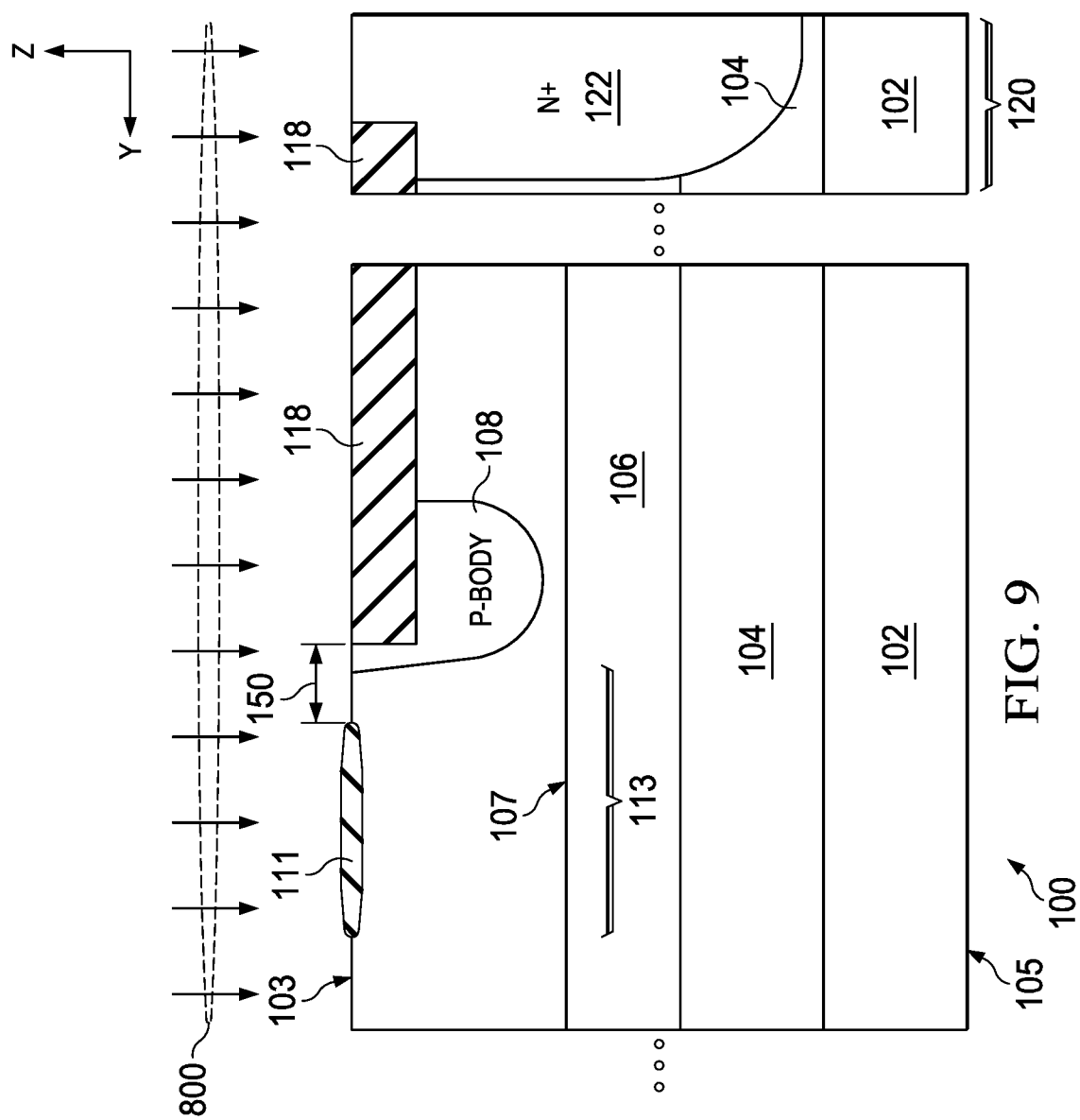

The method 400 also includes forming an oxide structure at 416 along the first side 103 of the semiconductor substrate 102. In the example of FIGS. 8 and 9, a local oxidation of silicon (LOCOS) process 800 is performed, which forms the oxide structure 111 along the top side 103 in a portion of a prospective drift region 113 (FIG. 1). The oxide structure 111 is formed at 416 over a prospective drift region. In the illustrated example, moreover, the oxide structure 111 is spaced by the distance 150 from the STI structure 118. Other oxide formation processes can be performed at 416 in other implementations. In one example, the oxide structure 111 is formed at 416 to a thickness of 500 angstroms or more and 1500 angstroms or less. In another example, the oxide structure 111 is formed at 416 to a thickness of 700 angstroms or more and 1100 angstroms or less. In a further example, the oxide structure 111 is formed at 416 to a thickness of 800 angstroms or more and 1000 angstroms or less.

Figure 10:
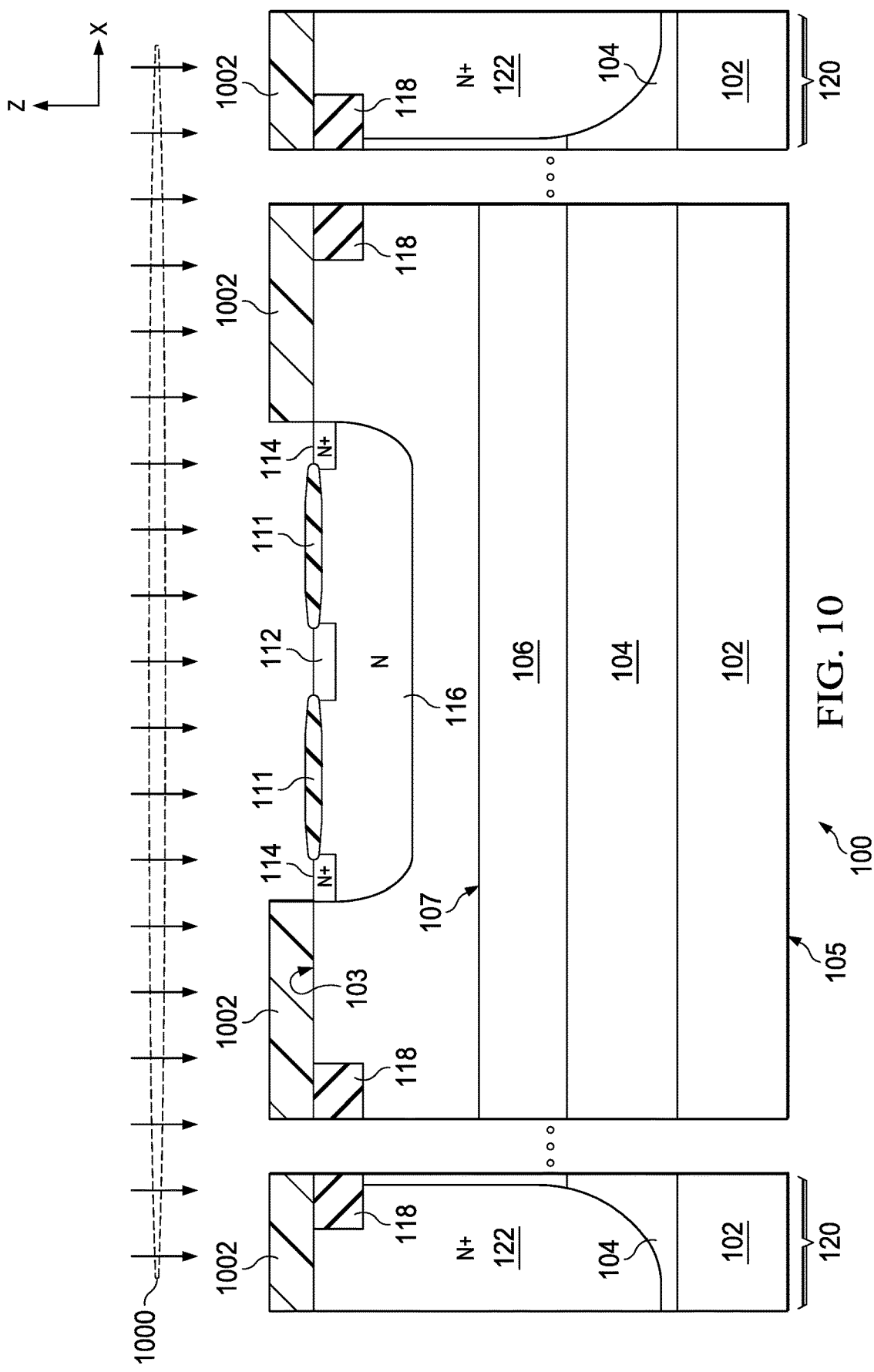

At 418 in FIG. 4, a least one implantation process is performed, such as an implantation process 1000 in FIG. 10, which implants n-type dopants into the semiconductor substrate 102 at a first energy and a first dopant concentration using a mask 1002. In one example, first and second drift region portions 114 and 116 are created at 418 by a process 1000 that includes corresponding first and second implantations that use a single implant mask 1002 and different implant energies. In certain implementations, moreover, the first and second implantation processes use different implant doses, although not a strict requirement of all possible implementations. In addition, the first and second implantation processes at 418 can use different dopant species (e.g., phosphorus, arsenic), and the individual first and second implantation processes can be implemented using multiple implants. In the example of FIG. 10, the mask 1002 is formed, which covers prospective source and body regions, and exposes the oxide structure 111 and a first portion of the first side 103 of the semiconductor substrate 102. The implantation process 1000 (418 in FIG. 4) forms the first drift region portion 114 that extends into the semiconductor substrate 102 along the Z direction from the first portion of the first side 103. In the example of FIG. 10, moreover, the first mask 1002 exposes the prospective drain region 112 laterally outward of the oxide structure 111 along the X direction. In this example, the process 1000 also implants the n-type dopants into the drain region 112. In other implementations, the mask 1002 covers the prospective drain region 112. In one example, the oxide structure 111 blocks the dopants from the first implantation process.

In various implementations, the thickness of the oxide structure 111 along the vertical (Z) direction is tuned in combination with the implant energy of the first implantation process to completely or substantially block implantation of dopants in the first implantation process at 418 into the substrate 102 beneath the oxide structure 111. This example also includes performing a second implantation process at 418 using the mask 1002, which implants n-type dopants into the semiconductor substrate 102 at a second energy and a second dopant concentration. The second example implantation at 418 forms the second drift region portion 116 that extends into the semiconductor substrate 102 at least partially under the oxide structure 111 along the Z direction. In one example, the second energy is greater than the first energy. In one example, the second implantation process 1000 includes more than one implant. In one example, a thermal anneal process is performed at 420, which activates the n-type drift region dopants implanted at 418.

Figure 11:
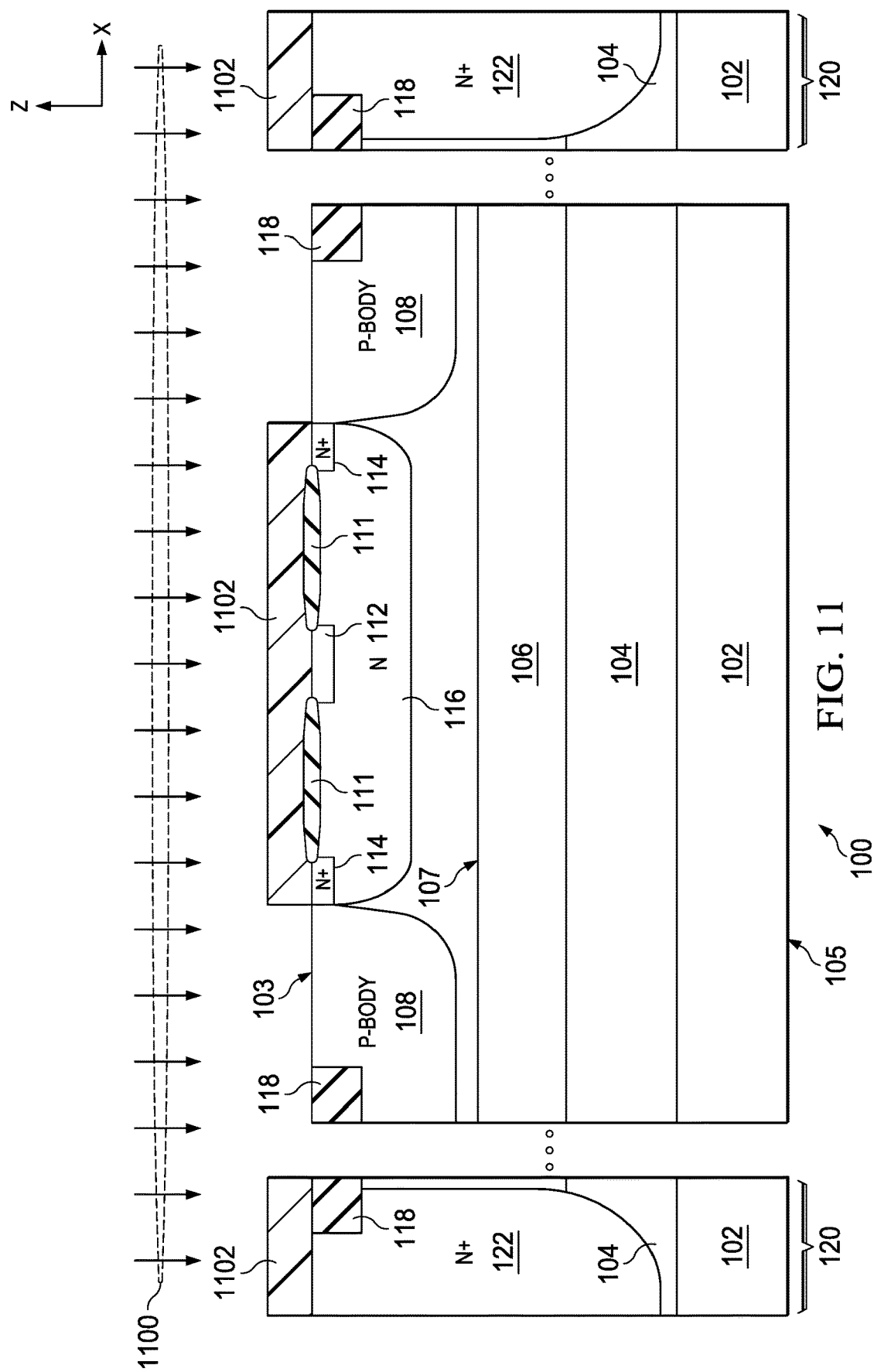
Figure 12:
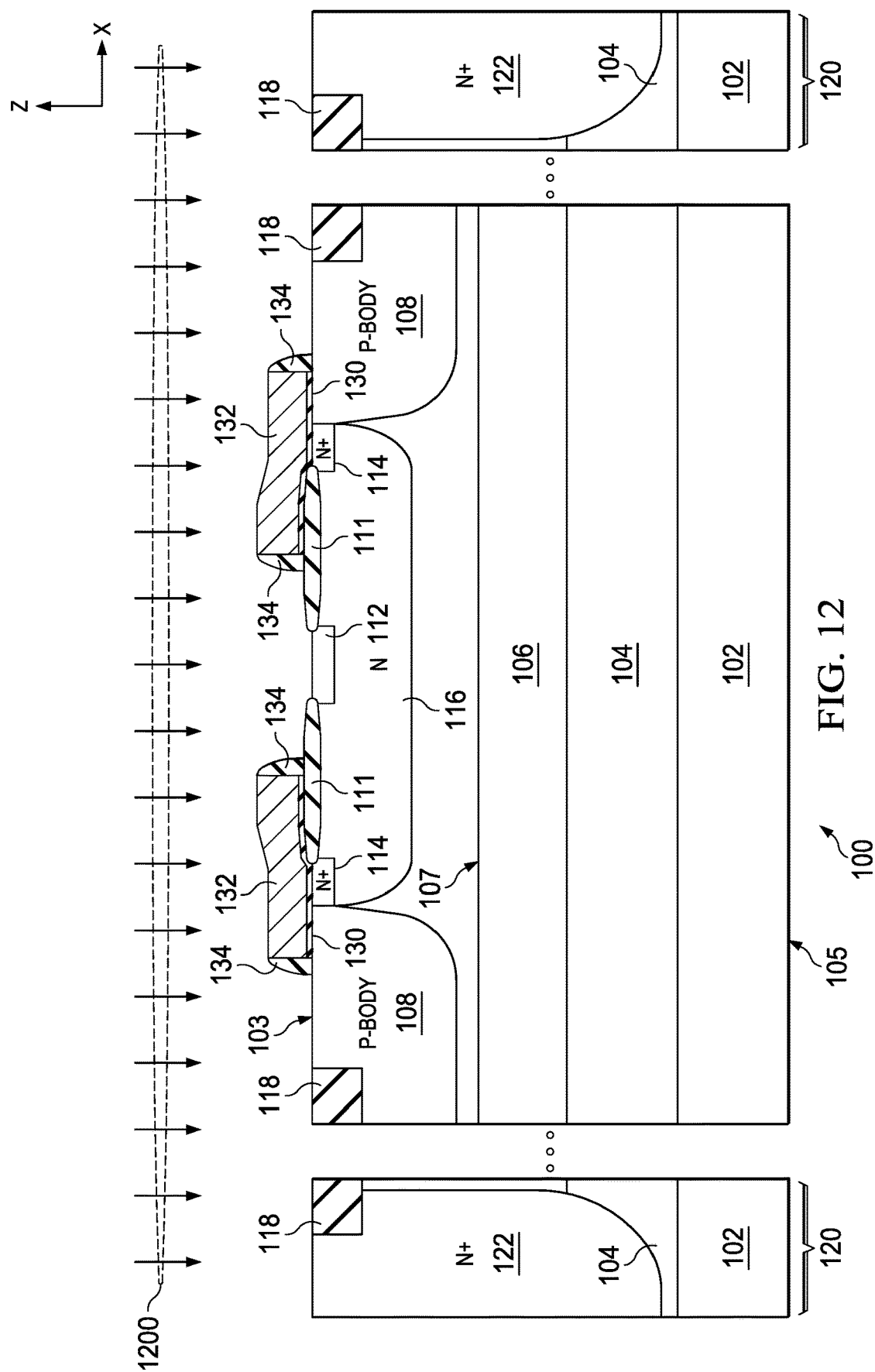

At 422 in FIG. 4, the method 400 further includes forming a source/drain implant mask and implanting p-type dopants to form a body region. FIG. 11 shows an example implantation process 1100 performed using a mask 1102, which forms the body region 108. The implanted body region 108 includes a channel portion 109 laterally adjacent the first drift region portion 114 along the X direction (FIG. 1). The example method 400 also includes forming a gate structure at 424. FIG. 12 shows an example, and which gate fabrication processing 1200 is performed to form the gate structure 117 over the channel portion 109 of the body region 108 and over a portion of the oxide structure 111. The gate dielectric layer 130 in this example extends over the channel region 109 of the body region 108, and extends over the connection (e.g., first) drift region portion 114 and a portion of the oxide structure 111 to form a short channel compact gate configuration to control the prospective drain extended transistor. The gate electrode 132 in this example is patterned polysilicon formed over a portion of the gate dielectric layer 130, and sidewall spacers 134 are formed along the lateral sides of the polysilicon gate electrode 132 as shown in FIG. 12.

Figure 13:
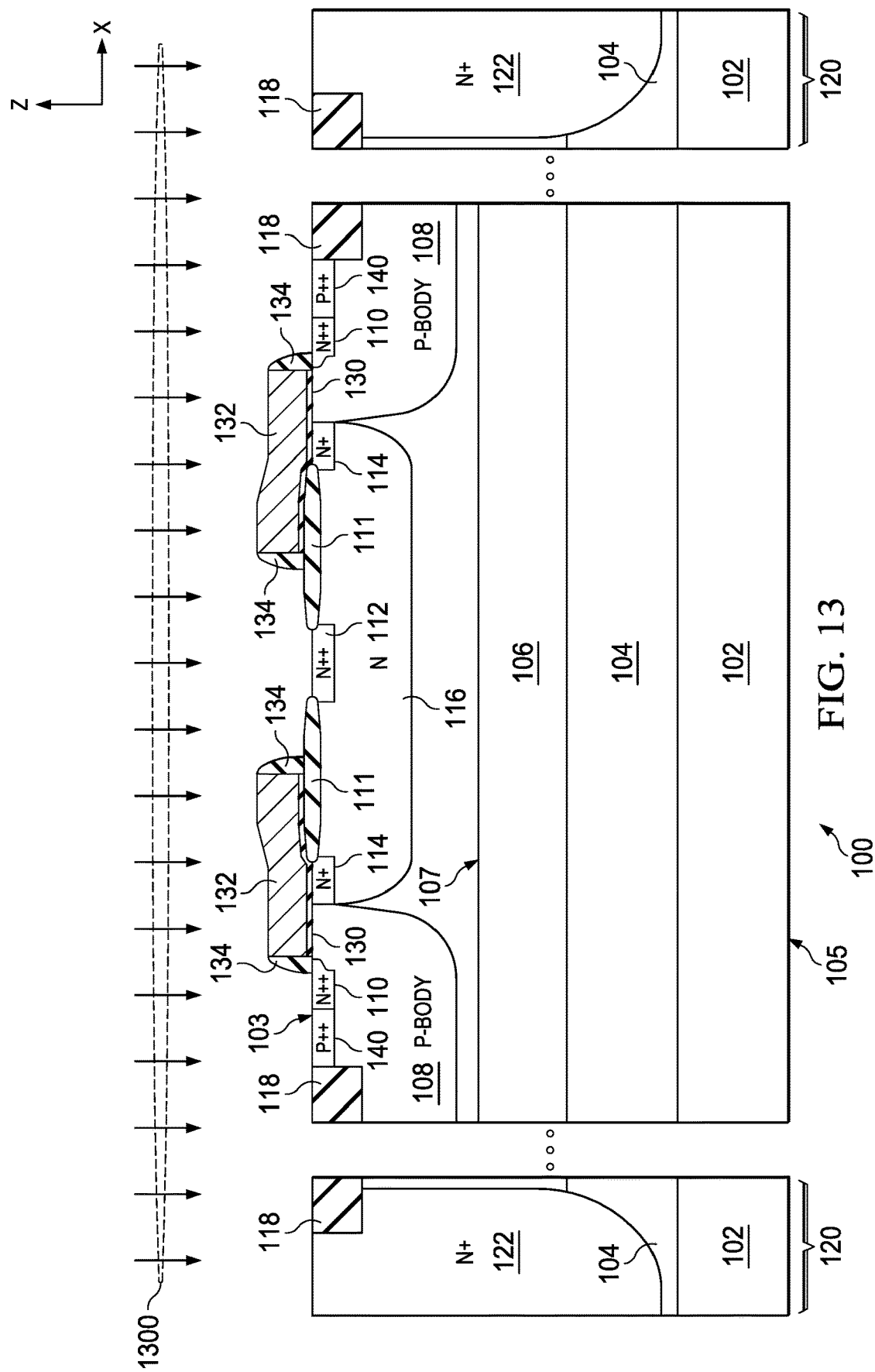

The method 400 continues at 426 in FIG. 4, including implanting the source region 110 and the drain region 112 with n-type dopants. FIG. 13 shows an example, in which implantation processing 1300 is performed with suitable implant masks (not shown). The implantation processing 1300 implants phosphorus or other n-type dopants to form the source region 110 adjacent the channel portion 109 of the body region 108, and the drain region 112 adjacent the second drift region portion 116 and the oxide structure 111. The implantation process 1300 in one example supplements the previously implanted n-type dopants in the drain region 112. In one example, the processing at 426 also includes performing a masked implantation process (not shown) to implant p-type dopants (e.g., boron), to form the p-type body contact region 140 shown in FIG. 13.

Figure 14:
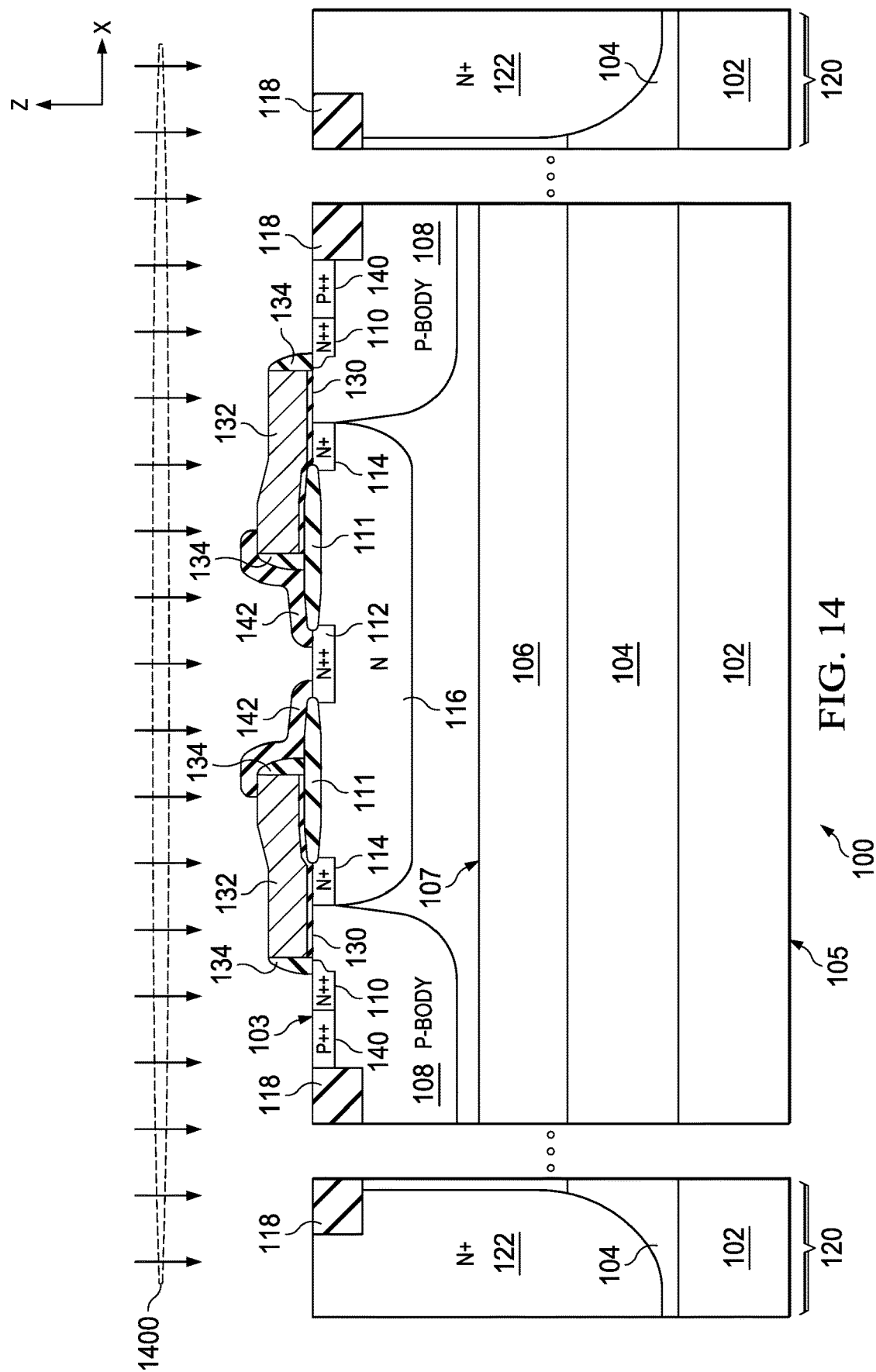
Figure 15:
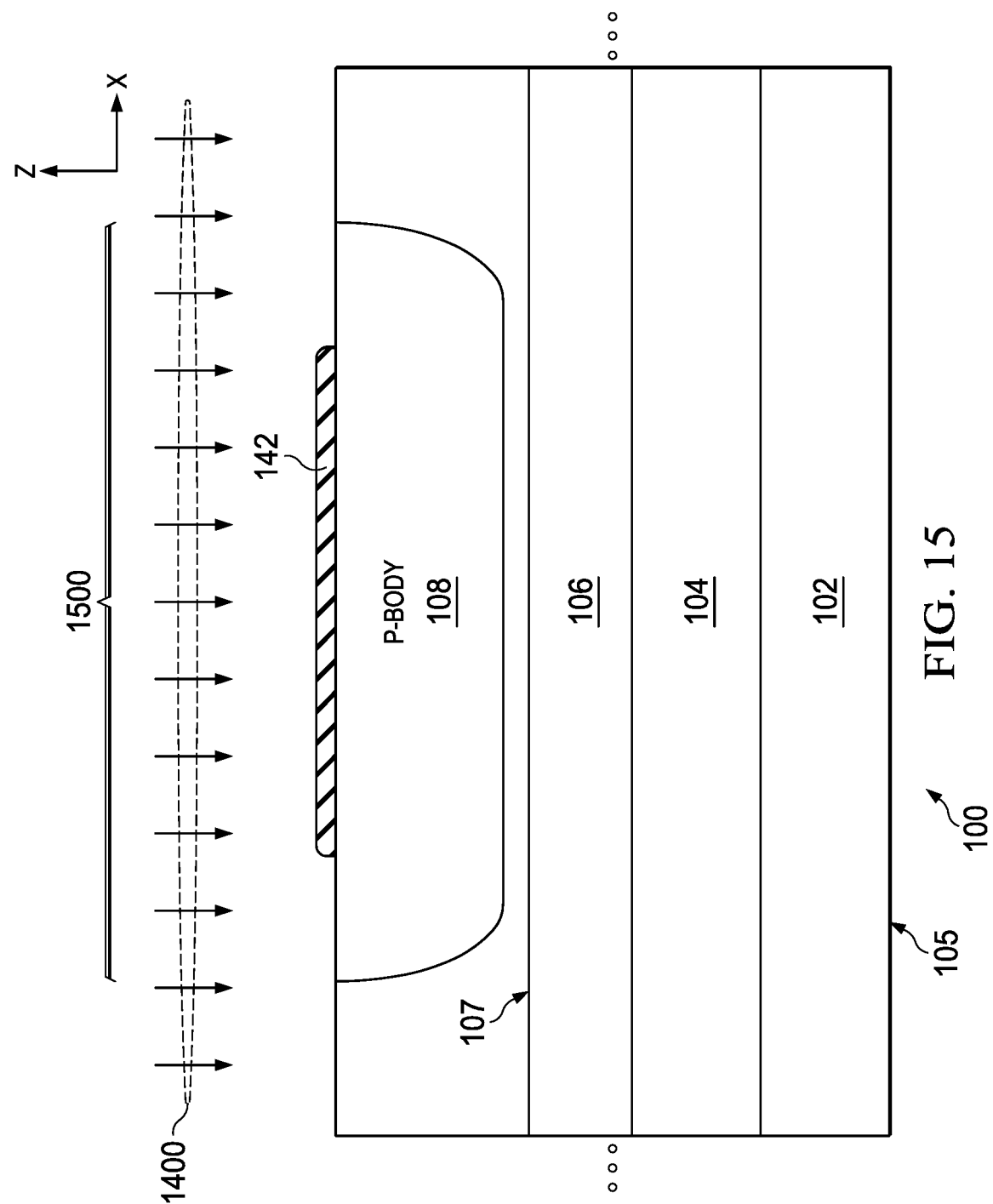

The method 400 also includes forming a protection layer at 428. In the example of FIG. 14, a process 1400 is used to deposit and pattern a silicide block material 142 that extends over the exposed portion of the oxide structure 111. In addition, the example protection layer material 142 in FIG. 14 extends partially over the gate electrode 132 and partially past the oxide structure 111. As previously mentioned, the protection layer material 142 in one example is a silicide block material that is used elsewhere in the fabrication of the IC 100. FIG. 15 shows another portion of the IC 100, in which a portion of the body region 108 is used to form a resistor component. In this example, the deposition and patterning processing at 428 is used to form a silicide block material structure 142 in the center regions of the prospective resistor component 1500, leaving end regions of the resistor structure 1500 exposed for subsequent solicitation to form first and second resistor terminals or contacts. In one example, the protection layer 142 includes an oxide material and/or a nitride material. The method 400 also includes further processing at 430, which forms contacts, metallization structures and to complete other back end processes to finish the integrated circuit 100.

Modifications are possible in the described embodiments, and other embodiments are possible, within the scope of the claims.

The following is claimed:

1. A drain extended transistor, comprising:
a body region in a semiconductor substrate, the body region including: majority carrier dopants of a first type; and a channel portion;
a source region in the semiconductor substrate, the source region in direct contact with the channel portion of the body region, the source region including majority carrier dopants of a second type;
an oxide structure that extends along a first side of the semiconductor substrate, the oxide structure including: a first end spaced from the channel portion of the body region; and a second end opposite the first end;
a drain region in the semiconductor substrate in direct contact with the second end of the oxide structure, the drain region including majority carrier dopants of the second type;
a drift region, including majority carrier dopants of the second type in the semiconductor substrate and extending from the channel portion of the body region to the drain region, wherein the drain region is more heavily doped than the drift region;
a gate structure, including: a gate dielectric layer formed over the first side of the substrate, a gate electrode on the gate dielectric layer, and a sidewall spacer adjacent the gate electrode;
a protection layer that extends on the oxide structure between the gate structure and the drain region, the protection layer including at least one of an oxide material, and a nitride material, and the protection layer extending over top surfaces of the oxide structure, the gate electrode, and the drain region; and
pre-metal dielectric layer over the protection layer.

2. The drain extended transistor of claim 1, wherein the protection layer extends on only a portion of the gate electrode, and wherein the protection layer extends on a portion of the drain region.

3. The drain extended transistor of claim 2, wherein the protection layer extends on the portion of the gate electrode by 0.1 µm or more, and wherein the protection layer extends on the portion of the drain region by 0.1 µm or more.

4. The drain extended transistor of claim 1, wherein the majority carrier dopants of the first type are p-type dopants, and the majority carrier dopants of the second type are n-type dopants.

5. The drain extended transistor of claim 1, wherein the oxide structure is a local oxidation of silicon (LOCOS) structure.

6. The drain extended transistor of claim 1, further comprising:
an isolation structure that laterally surrounds an active region of the semiconductor substrate, the isolation structure including a shallow trench isolation (STI) structure that defines an end of the active region of the semiconductor substrate;
wherein the STI structure is laterally spaced from the oxide structure by a first distance.

7. The drain extended transistor of claim 6, wherein the first distance is 0.5 µm or more.

8. A drain extended transistor, comprising:
a body region in a semiconductor substrate, the body region including: majority carrier dopants of a first type; and a channel portion;
a source region in the semiconductor substrate, the source region adjacent the channel portion of the body region, the source region including majority carrier dopants of a second type;
an oxide structure that extends along a first side of the semiconductor substrate, the oxide structure including: a first end spaced from the channel portion of the body region; and a second end opposite the first end;
a drain region in the semiconductor substrate adjacent the second end of the oxide structure, the drain region including majority carrier dopants of the second type;
a drift region, including majority carrier dopants of the second type in the semiconductor substrate and extending from the channel portion of the body region to the drain region;
a gate structure, including: a gate dielectric layer formed over the first side of the substrate; and a gate electrode on the gate dielectric layer;
a protection layer that extends on the oxide structure between the gate structure and the drain region, the protection layer including at least one of an oxide material, and a nitride material;
an isolation structure that laterally surrounds an active region of the semiconductor substrate, the isolation structure including a shallow trench isolation (STI) structure that defines an end of the active region of the semiconductor substrate, wherein the STI structure is laterally spaced from the oxide structure by a first distance;
a plurality of substantially parallel transistor fingers, each transistor finger including: a source finger that extends in the active region of the semiconductor substrate between a first finger end and a second finger end, a drain finger that extends in the active region of the semiconductor substrate between the first finger end and the second finger end, and a gate finger; and
a gate contact electrically connected to a first portion of the gate electrode outside the active region of the semiconductor substrate;
wherein the source region includes a plurality of the source fingers;
wherein the drain region includes a plurality of the drain fingers;
wherein the gate structure includes a plurality of the gate fingers, and the gate structure extends beyond a first transistor end outside the active region of the semiconductor substrate; and
wherein the first portion of the gate electrode overlaps the STI structure in a plan view.

9. The drain extended transistor of claim 8, wherein the oxide structure is a local oxidation of silicon (LOCOS) structure.

10. An integrated circuit (IC), comprising:
a semiconductor substrate, including: a first side; and a second side spaced from the first side along a first direction;

a first doped layer in the substrate, the first doped layer including majority carrier dopants of a first type;

a drain extended transistor, comprising:

a body region that extends along the first direction into the semiconductor substrate, the body region including: majority carrier dopants of the first type; and a channel portion;

a source region that extends along the first direction into the semiconductor substrate from the first side of the semiconductor substrate, the source region in direct contact with a first side of the channel portion of the body region, the source region including majority carrier dopants of a second type;

an oxide structure that extends along the first side of the semiconductor substrate, the oxide structure including: a first end spaced along a second direction from the channel portion of the body region; and a second end;

a drain region that extends along the first direction into the semiconductor substrate from the first side, the drain region including: majority carrier dopants of the second type, and a first end in direct contact with the second end of the oxide structure;

a drift region, including majority carrier dopants of the second type, the drift region extending along the first direction into the semiconductor substrate from the first side and extending along the second direction from the channel portion of the body region to the drain region, wherein the drain region is more heavily doped than the drift region;

a gate structure, including: a gate dielectric layer formed over the first side of the substrate, a gate electrode on the gate dielectric layer, and sidewall spacers adjacent the gate electrode; and a protection layer that extends on the oxide structure between the gate structure and the drain region, the protection layer including at least one of an oxide material, and a nitride material, the protection layer extending over only a portion of a top surface of the gate electrode and over a portion of a top surface of the drain region; and a pre-metal dielectric layer over the protection layer.

11. The IC of claim 10, wherein the protection layer extends on the portion of the gate electrode by 0.1 µm or more, and wherein the protection layer extends on the portion of the drain region by 0.1 µm or more.

12. The IC of claim 10, further comprising:

an isolation structure that laterally surrounds an active region of the semiconductor substrate, the isolation structure including a shallow trench isolation (STI) structure that defines an end of the active region of the semiconductor substrate;

wherein the STI structure is laterally spaced from the oxide structure by a first distance along a third direction substantially perpendicular to the second direction.

13. The IC of claim 12, wherein the first distance is 0.5 µm or more.

14. An integrated circuit (IC), comprising:

a semiconductor substrate, including: a first side; and a second side spaced from the first side along a first direction;

an isolation structure that laterally surrounds an active region of the semiconductor substrate, the isolation structure including a shallow trench isolation (STI) structure that defines an end of the active region of the semiconductor substrate;

a first doped layer in the active region of the substrate, the first doped layer including majority carrier dopants of a first type;

a drain extended transistor, comprising:

a body region that extends along the first direction into the semiconductor substrate, the body region including: majority carrier dopants of the first type; and a channel portion;

a source region that extends along the first direction into the semiconductor substrate from the first side of the semiconductor substrate, the source region adjacent a first side (inner) of the channel portion of the body region, the source region including majority carrier dopants of a second type;

an oxide structure that extends along the first side of the semiconductor substrate, the oxide structure including: a first end spaced along a second direction from the channel portion of the body region; and a second end;

a drain region that extends along the first direction into the semiconductor substrate from the first side, the drain region including: majority carrier dopants of the second type, and a first end adjacent the second end of the oxide structure;

a drift region, including majority carrier dopants of the second type, and extending along the second direction from the channel portion of the body region to the drain region; and a gate structure, including: a gate dielectric layer formed over the first side of the substrate; and a gate electrode on the gate dielectric layer;

wherein the STI structure is laterally spaced from the oxide structure by a first distance along a third direction substantially perpendicular to the second direction; and a plurality of substantially parallel transistor fingers that extend along the third direction, each transistor finger including a source finger that extends in the active region of the semiconductor substrate between a first finger end and a second finger end along the third direction, a drain finger that extends in the active region of the semiconductor substrate between the first finger end and the second finger end along the third direction, a gate finger that extends along the third direction; and a gate contact electrically connected to a first portion of the gate electrode outside the active region of the semiconductor substrate;

wherein the source region includes a plurality of the source fingers;

wherein the drain region includes a plurality of the drain fingers;

wherein the gate structure includes a plurality of the gate fingers, and the gate structure extends beyond a first transistor end along the third direction outside the active region of the semiconductor substrate; and wherein the first portion of the gate electrode overlaps the STI structure in a plan view.

15. The IC of claim 14, wherein the first distance is 0.5 µm or more.

16. The IC of claim 14, wherein the oxide structure is a local oxidation of silicon (LOCOS) structure.

* * * * *